US009386693B2

(12) United States Patent
Gruhl

(10) Patent No.: US 9,386,693 B2
(45) Date of Patent: Jul. 5, 2016

(54) BOARD INTEGRATED INTERCONNECT

(71) Applicant: Tim Gruhl, Palmdale, CA (US)

(72) Inventor: Tim Gruhl, Palmdale, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 123 days.

(21) Appl. No.: 14/269,736

(22) Filed: May 5, 2014

(65) Prior Publication Data

US 2015/0319850 A1 Nov. 5, 2015

(51) Int. Cl.
| H05K 1/14 | (2006.01) |
| H05K 1/03 | (2006.01) |
| H05K 1/00 | (2006.01) |
| H05K 1/02 | (2006.01) |
| H05K 3/46 | (2006.01) |
| B29C 67/00 | (2006.01) |
| H01L 21/48 | (2006.01) |
| H05K 3/40 | (2006.01) |
| B29L 31/34 | (2006.01) |
| H05K 3/12 | (2006.01) |

(52) U.S. Cl.
CPC .......... *H05K 1/0284* (2013.01); *B29C 67/0055* (2013.01); *H01L 21/4846* (2013.01); *H05K 3/4007* (2013.01); *H05K 3/46* (2013.01); *B29L 2031/3425* (2013.01); *H05K 3/1241* (2013.01); *H05K 3/4084* (2013.01); *H05K 3/4611* (2013.01); *H05K 3/4664* (2013.01); *H05K 2201/0382* (2013.01); *H05K 2201/09036* (2013.01); *H05K 2201/09754* (2013.01); *H05K 2201/2009* (2013.01); *H05K 2203/013* (2013.01)

(58) Field of Classification Search
CPC .................. H05K 1/0284; H05K 2201/09754
USPC .................. 439/55, 74, 78; 174/255; 361/736
See application file for complete search history.

(56) References Cited

U.S. PATENT DOCUMENTS

| 3,353,070 | A | | 11/1967 | Paul | |
| 4,109,298 | A | | 8/1978 | Hanni | |
| 4,668,033 | A | * | 5/1987 | Reichardt | H05K 1/119 439/79 |
| 4,688,867 | A | | 8/1987 | Reichardt | |
| 5,012,391 | A | | 4/1991 | Schultz, Jr. | |
| 5,132,877 | A | * | 7/1992 | Branan | H05K 1/119 361/736 |
| 5,156,552 | A | * | 10/1992 | Zaderej | H05K 1/119 439/59 |
| 5,397,239 | A | * | 3/1995 | Zaderej | H05K 1/0278 174/254 |
| 5,433,819 | A | * | 7/1995 | McMeen | H05K 3/281 216/105 |
| 5,521,992 | A | | 5/1996 | Chun | |
| 5,675,888 | A | | 10/1997 | Owen | |
| 5,914,534 | A | | 6/1999 | Todd | |
| 6,506,062 | B1 | * | 1/2003 | Patel | H05K 3/4092 174/267 |

(Continued)

OTHER PUBLICATIONS

Communication, Extended European Search Report, European Patent Office, Application No. 15162923.5-1806, Dated Sep. 9, 2015, 7 pages.

(Continued)

*Primary Examiner* — Sherman Ng
(74) *Attorney, Agent, or Firm* — Baker Botts L.L.P.

(57) ABSTRACT

In an embodiment, a method includes forming a printed circuit board by depositing a first plurality of layers and forming an interconnect integral to the printed circuit board by depositing a second plurality of layers on at least a portion of the first plurality of layers. The interconnect includes a stabilizing structure and a contact positioned within the stabilizing structure. The stabilizing structure includes a first material and the contact includes a second material that is different than the first material.

20 Claims, 3 Drawing Sheets

(56) References Cited

U.S. PATENT DOCUMENTS

| | | |
|---|---|---|
| 7,277,770 B2 | 10/2007 | Huang |
| 8,067,305 B2 | 11/2011 | Zafiropoulo |
| 2007/0148817 A1 | 6/2007 | Williams et al. |
| 2010/0000088 A1 | 1/2010 | Legtenberg |
| 2010/0072631 A1 | 3/2010 | Marion |
| 2012/0045909 A1 | 2/2012 | Pischler |
| 2012/0067637 A1 | 3/2012 | Chow |

OTHER PUBLICATIONS

Core 77 Newsletter, Carbomorph Materials 3D-Printed Electronics, from Any 3D Printer, Core 77, http://www.core77.com/blog/materials/carbomorph_material_enables_3d-printed_Core 77 Newsletter: electronics_from_any_3d_printer_23947.asp, printed Apr. 23, 2014, 3 pages.

* cited by examiner

BOARD INTEGRATED INTERCONNECT

TECHNICAL FIELD

This disclosure generally relates to printed circuit boards, and more particularly to a board integrated interconnect.

BACKGROUND

Consumers are frequently demanding smaller, portable devices. Additionally, many devices, such as missiles and aircraft, are restricted in size. As a result, circuit boards are also becoming smaller thereby decreasing the available space on the circuit boards for connections.

BRIEF DESCRIPTION OF THE DRAWINGS

For a more complete understanding of the present disclosure, and for further features and advantages thereof, reference is now made to the following description taken in conjunction with the accompanying drawings, in which.

DETAILED DESCRIPTION

As consumer devices are being reduced in size, printed circuit boards used within the devices are also being reduced in size. Additionally, some devices are necessarily limited in their size, such as a missile. As a result, the devices may not have space for printed circuit boards with bulky interconnects. Moreover, traditional manufacturing techniques typically involve solder joints between the printed circuit board and the interconnect, which may cause a loss in signal integrity.

Accordingly, aspects of the present disclosure include, in one embodiment, forming a printed circuit board by depositing a first plurality of layers and forming an interconnect integral to the printed circuit board by depositing a second plurality of layers on at least a portion of the first plurality of layers. The interconnect may include a stabilizing structure and a contact positioned within the stabilizing structure. The stabilizing structure may be made of a first material and the contact may be made of a second material that is different than the first material.

Board integrated interconnect apparatus 100 of the present disclosure provides numerous advantages. As one advantage, some embodiments may reduce the profile of printed circuit board 110 thereby allowing one or more printed circuit boards 110 to fit within a small device. As another advantage, certain embodiments may improve the yield in the manufacturing process by reducing the need for soldering techniques. As another advantage, some embodiments may reduce the need for electrical connections by utilizing optical connections. As another advantage, some embodiments may improve signal quality by reducing the usage of solder joints between printed circuit board 110 and interconnects 120.

Figure 1:
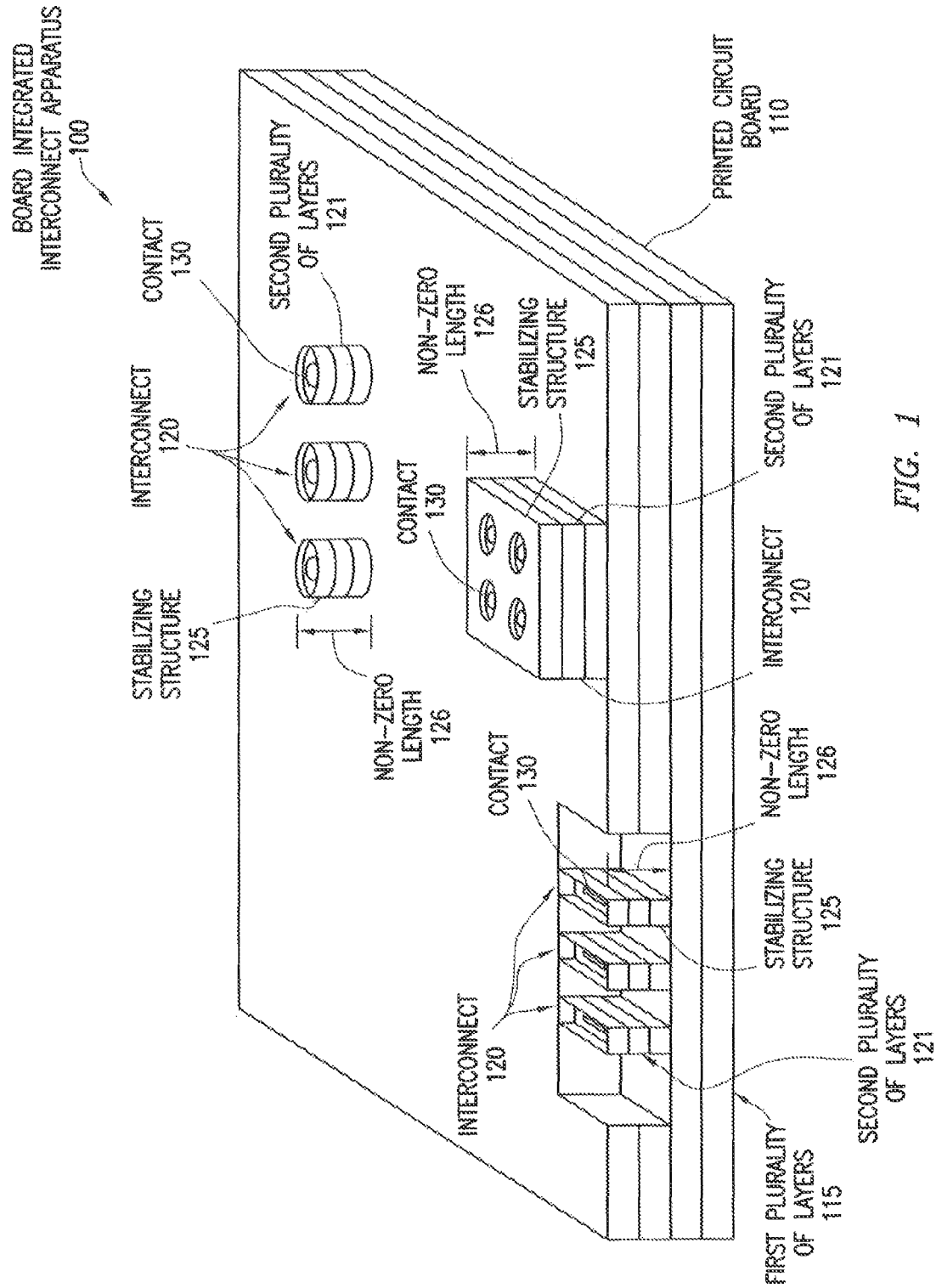
FIG. 1 is a perspective view of an example board integrated interconnect apparatus, according to certain embodiments of the present disclosure.
Figure 2:
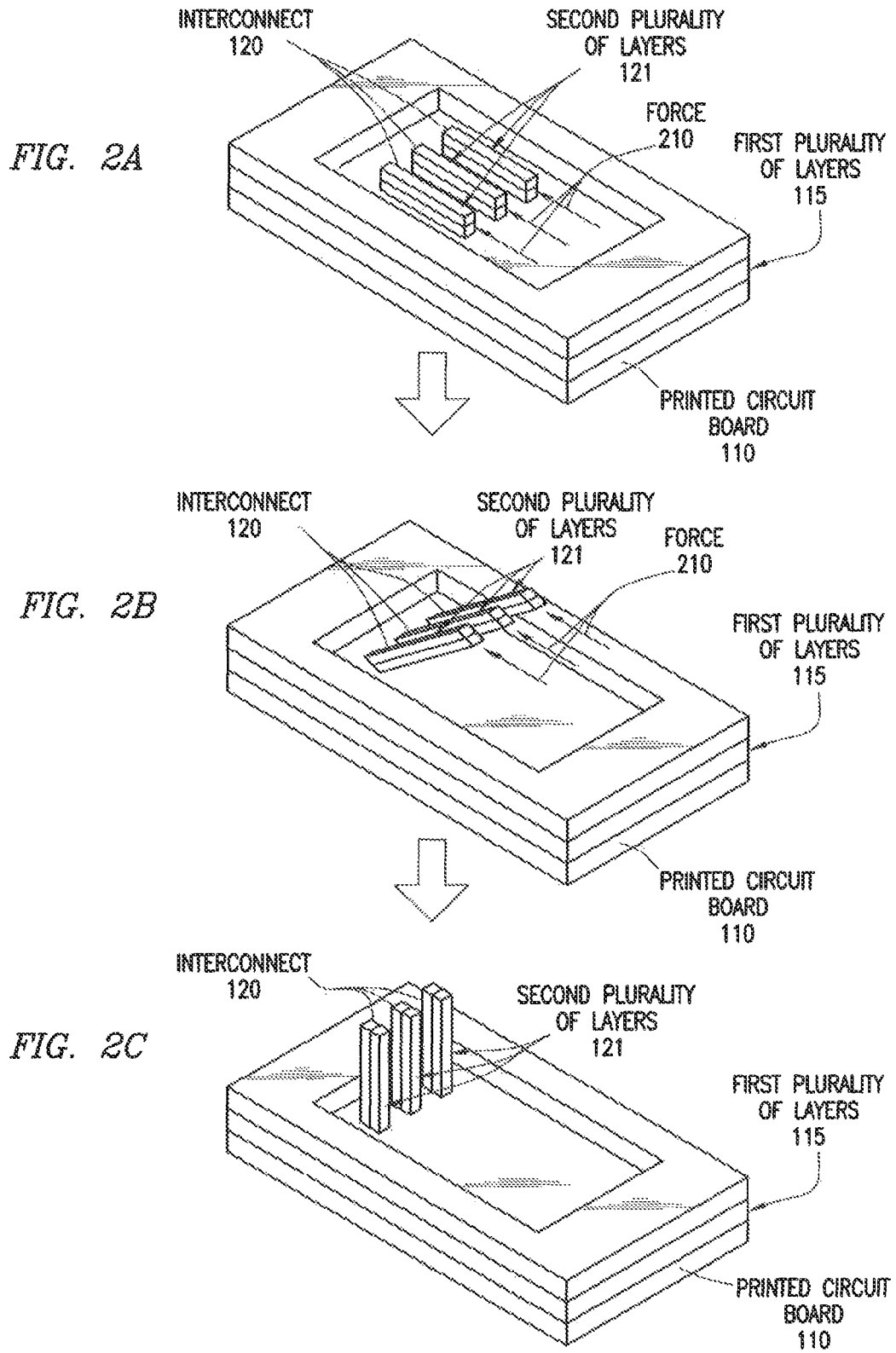
FIG. 2A is a perspective view of an example printed circuit board with an interconnect before reorientation of the interconnect, according to certain embodiments of the present disclosure.
FIG. 2B is a perspective view of the example printed circuit board with the interconnect of FIG. 2A during reorientation of the interconnect, according to certain embodiments of the present disclosure.
FIG. 2C is a perspective view of the example printed circuit board with the interconnect of FIG. 2A after reorientation of the interconnect, according to certain embodiments of the present disclosure.
Figure 3:
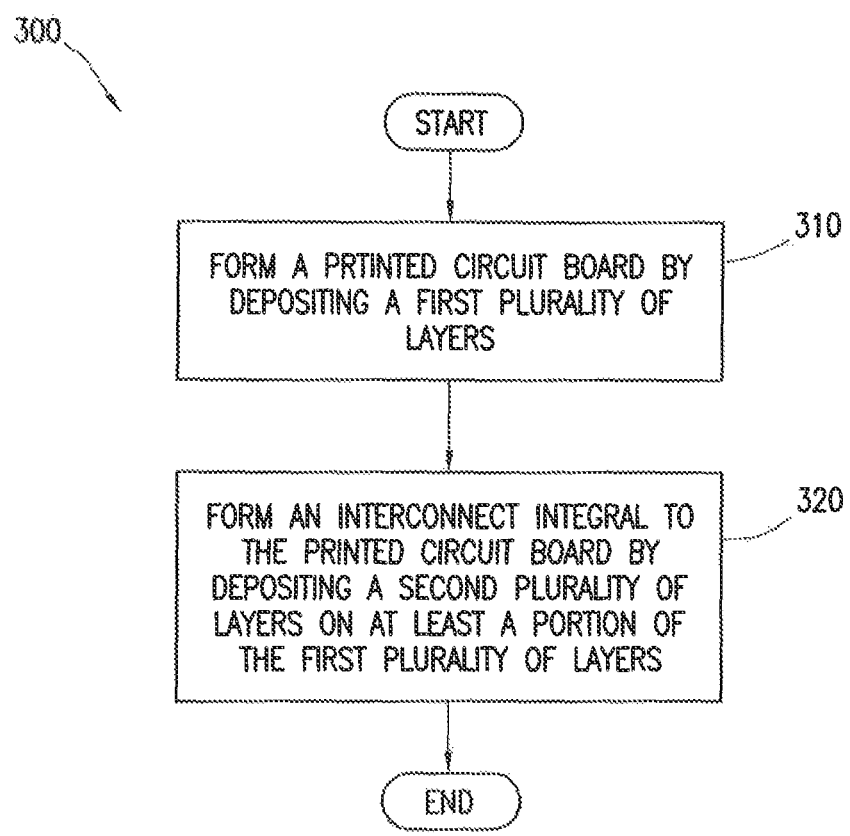
FIG. 3 is a flow chart illustrating an example method of forming a printed circuit board with an interconnect integral to the printed circuit board, according to certain embodiments of the present disclosure.

Additional details are discussed in FIGS. 1 through 3. FIG. 1 illustrates an example board integrated interconnect apparatus 100. FIGS. 2A-2C show an example printed circuit board 110 with interconnects 120 before, during, and after reorientation of interconnects 120. FIG. 3 shows an example method of forming printed circuit board 110 with interconnect 120 integral to printed circuit board 110.

FIG. 1 illustrates an example board integrated interconnect apparatus 100, according to certain embodiments of the present disclosure. Board integrated interconnect apparatus 100 may be printed circuit board 110 with one or more interconnects 120 formed integrally with printed circuit board 110 in some embodiments. Board integrated interconnect apparatus 100 may include printed circuit board 110, first plurality of layers 115, interconnects 120, second plurality of layers 121, stabilizing structures 125, non-zero lengths 126, and contacts 130 in an embodiment.

Printed circuit board 110 may be any component configured to support and connect components in some embodiments. Printed circuit board 110 may reside within a device in some embodiments. For example, printed circuit board 110 may reside within a missile. As another example, printed circuit board 110 may reside in a cellular device. Printed circuit board 110 may support electrical components in some embodiments. For example, printed circuit board 110 may support capacitors, resistors, or other electronic components. Printed circuit board 110 may support optical components in some embodiments. Printed circuit board 110 may also support interconnect 120 in some embodiments. Printed circuit board 110 may be coupled to another printed circuit board using interconnect 120 in certain embodiments. Printed circuit board 110 may be coupled to any electrical or optical component using interconnect 120 in some embodiments. Printed circuit board 110 may be single sided, double sided, or multilayer in some embodiments.

Printed circuit board 110 may be manufactured using a variety of different manufacturing process. Printed circuit board 110 may be manufactured using a laminating process in an embodiment. In the laminating process, printed circuit, board 110 may have various layers of laminates with etched copper connecting electronic components. Etched copper may join different layers of printed circuit board 110 in some embodiments. Printed circuit board 110 may be formed using a three-dimensional printing process in certain embodiments. Three-dimensional printing may include laying successive layers of material to form printed circuit board 110. These layers may be joined or fused to create the final shape of printed circuit board 110. In either manufacturing method, printed circuit board 110 may include first plurality of layers 115.

First plurality of layers 115 may include two or more layers forming printed circuit board 110 in an embodiment. First plurality of layers 115 may be made of any type of material. For example, first plurality of layers 115 may be made of a woven glass epoxy. First plurality of layers 115 may be made of a non-conductive material in certain embodiments. As noted above, first plurality of layers 115 may be formed using a laminating process or a three-dimensional printing process in certain embodiments. First plurality of layers 115, which form printed circuit board 110, may support interconnects 120 in certain embodiments.

Interconnect 120 may be any component configured to interface with an electronic or optical component in certain embodiments. For example, interconnect 120 may be a component that connects another component, such as a graphics card, to printed circuit board 110. As another example, interconnect 120 may be a structure that couples printed circuit board 110 to another printed circuit board. As another example, interconnect 120 may be a socket for an integrated circuit, such as a microprocessor. Interconnect 120 may be formed integrally with printed circuit board 110 in certain embodiments. For example, interconnect 120 may be formed together with printed circuit board 110 during the laminating or three-dimensional printing process. Because interconnect 120 may be integrally formed with printed circuit board 110, interconnect 120 need not be soldered to printed circuit board 110 in certain embodiments. Forming interconnect 120 integrally with printed circuit board 110 rather than soldering interconnect 120 to printed circuit board 110 may improve signal quality. Interconnect 120 may include second plurality of layers 121, stabilizing structures 125, non-zero length 126, and contacts 130 in an embodiment.

Second plurality of layers 121 may be two or more layers forming stabilizing structure 125 of interconnect 120. Second plurality of layers 121 may be made of any material in some embodiments. For example, second plurality of layers 121 may be a woven glass epoxy. Second plurality of layers 121 may be a non-conductive material in certain embodiments. Second plurality of layers 121 may be made of a material different than the material used for first plurality of layers 115 in an embodiment. Second plurality of layers 121 may be formed in any shape in some embodiments. For example, second plurality of layers 121 may be formed in a rectangular, square, or circular shape. Second plurality of layers 121 may be formed using a laminating process or a three-dimension printing process. For example, second plurality of layers 121 may be built up on top of first plurality of layers 115 using three-dimensional printing in an embodiment. As another example, first plurality of layers 115 may be built up around second plurality of layers 121 so that second plurality of layers 121 may be recessed within printed circuit board 110. As another example, second plurality of layers 121 may be deposited on an already-existing printed circuit board 110. In these examples, second plurality of layers 121 may be integral to printed circuit board 110. As will be discussed in FIGS. 2A and 2B, second plurality of layers 121 may be formed in plane with printed circuit board 110 and reoriented in a direction normal to printed circuit board 110 in some embodiments. Second plurality of layers 121 may form stabilizing structure 125 in certain embodiments.

Stabilizing structure 125 may be any structure configured to support contact 130 in some embodiments. Stabilizing structure 125 may be formed in any shape. For example, stabilizing structure 125 may be rectangular, square, or circular in shape. Stabilizing structure 125 may be made of any material in some embodiments. For example, stabilizing structure may be made of a woven glass epoxy. Stabilizing structure 125 may be made of a non-conductive material in certain embodiments. Stabilizing structure 125 may be flexible during the manufacturing process to facilitate reorientation of stabilizing structure 125 from a position in plane with printed circuit board 110 to a position normal to printed circuit board 110 in certain embodiments. A stabilizing agent, such as an epoxy, glue, or molded thermal plastic, may be applied to stabilizing structure 125 to harden stabilizing structure 125 after reorientation in some embodiments. Stabilizing structure 125 may be made of a different material than printed circuit board 110 to ensure that stabilizing structure 125 remains flexible during the manufacturing process in an embodiment. For example, stabilizing structure 125 may be made of a material with a higher glass transition temperature than the material used for printed circuit board 110. As another example, stabilizing structure 125 may be made of a highly porous material that is subsequently soaked in epoxy to harden stabilizing structure 125. Stabilizing structure 125 may be made of a thinner material than printed circuit board 110 to facilitate the flexibility of stabilizing structure 125. Stabilizing structure 125 of interconnect 120 may extend non-zero length 126 in a direction normal to a surface of printed circuit board 110.

Non-zero length 126 may be any distance normal to a surface of printed circuit board 110 in some embodiments. Non-zero length 126 may be a distance above the top layer of printed circuit board 110 in certain embodiments. Non-zero length 126 may be a distance below the top layer of printed circuit board 110 in some embodiments. For example, non-zero length 126 may be a distance from the top layer of printed circuit board 110 to an internal layer of printed circuit board 110 so that interconnect 120 is recessed within printed circuit board 110. Such a recessed interconnect 120 reduces the profile of printed circuit board 110 thereby allowing printed circuit board 110 to fit within devices having limited volumes.

Contact 130 may be any component configured to provide a link between components of printed circuit board 110 and other electronic components in an embodiment. For example, contact 130 may provide a link between an attached graphics card and a microprocessor attached to printed circuit board 110. Contact 130 may be made of a conductive material in certain embodiments. Contact 130 may be an electrical contact in certain embodiments. In other embodiments, contact 130 may be an optical contact. For example, contact 130 may be a fiber optic connector. Contact 130 may be configured to interface with any component coupled to printed circuit board 110, such as a graphics card, in certain embodiments. Contact 130 may be formed in any shape in some embodiments. For example, contact 130 may be rectangular, square, or circular in shape.

Contact 130 may be formed using a variety of different manufacturing processes. Contact 130 may be formed during the laminating or three-dimensional printing process in an embodiment. In either the laminating process or the three-dimensional printing process, contact 130 may be formed subsequent to stabilizing structure 125 in an embodiment. For example, contact 130 may be "flowed" into a channel formed by stabilizing structure 125. That is, the material forming contact 130 may be heated to a liquid state so that it may be flowed into the channel formed by stabilizing structure 125. As another example, contact 130 may be printed into the channel formed by stabilizing structure 125 using a three-dimensional printing process. Contact 130 may be formed prior to stabilizing structure 125 in certain embodiments. For example, contact 130 may be built up on printed circuit board 110 and then stabilizing structure 125 may be formed around contact 130. In that scenario, at least a portion of contact 130 must be left exposed to interface with an external component.

FIG. 2A illustrates an example printed circuit board 110 with interconnects 120 before reorientation of interconnects 120, according to certain embodiments of the present disclosure. As noted above, printed circuit board 110 and interconnects 120 may be formed using a laminating process or a three-dimensional printing process in some embodiments. In either of those processes, interconnects 120 may be formed in a plane of printed circuit board 110 and reoriented to a position normal to printed circuit board 110 in certain embodiments. As shown in FIG. 2A, interconnects 120 may be positioned in plane with printed circuit board 110. Interconnects 120 may be initially flexible to allow for subsequent reorientation in some embodiments. For example, interconnects 120 may be initially flexible, but subsequently hardened during or after reorientation using a stabilizing agent, such as an epoxy, glue, or molded thermal plastic, in an embodiment. Interconnects 120 may be reoriented by force 210 in some embodiments.

Force 210 may be any force sufficient to reorient interconnects 120 from a position in plane with printed circuit board 110 to a position normal to printed circuit board 110. Force 210 may be applied by a human or a mechanical device in certain embodiments. For example, a human may use a finger to reorient interconnects 120. As another example, a machine may use a tool to reorient interconnects 120. Force 210 may reorient interconnects 120 to a direction normal to printed circuit board 110 as shown in FIGS. 2B-2C in an embodiment.

FIG. 2B illustrates the example printed circuit board 110 with interconnects 120 of FIG. 2A during reorientation of interconnects 120, according to certain embodiments of the present disclosure. As force 210 is applied to interconnects 210, interconnects 210 are reoriented from an initial position in plane with circuit board 110 towards a position normal to circuit board 110 in an embodiment.

FIG. 2C illustrates the example printed circuit board 110 with interconnects 120 of FIGS. 2A-2B after reorientation of interconnects 120, according to certain embodiments of the present disclosure. After or during reorientation, interconnects 120 may be hardened from their prior flexible state. For example, a material, such as an epoxy, glue, or molded thermal plastic, may be applied to interconnects 120 to cause interconnects 120 to harden. Hardening interconnects 120 may allow interconnects 120 to support external components, such as another printed circuit board. Once force 210 reorients interconnects 120 from a direction in plane with printed circuit board 110 to a direction normal to printed circuit board 110, interconnects 120 may be coupled to an external component, such as an electrical, optical, or any other type of component.

FIG. 3 illustrates an example method 300 of forming printed circuit board 110 with interconnect 120 integral to printed circuit board 110, according to certain embodiments of the present disclosure. Method 300 begins at step 310 where printed circuit board 110 may be formed by depositing first plurality of layers 115. First plurality of layers 115 may be formed using a laminating process in some embodiments. In other embodiments, first plurality of layers 115 may be formed using a three-dimensional printing process.

At step 320, interconnect 120 may be formed integral to printed circuit board 110 by depositing second plurality of layers 121 on at least a portion of first plurality of layers 115. For example, second plurality of layers 121 may be formed on a square portion of the top surface of first plurality of layers 115. Interconnect 120 may be formed using a laminating process in an embodiment. Interconnect 120 may be formed using a three-dimensional printing process in some embodiments. Interconnect 120 may include stabilizing structure 125 and contact 130 in an embodiment. Contact 130 may be positioned within stabilizing structure 125 in an embodiment. Stabilizing structure 125 may be made of a first material and contact 130 may be made of a second material that is different than the first material. As discussed above with reference to FIGS. 2A and 2B, interconnect 120 may be formed in plane with printed circuit board 110 in an embodiment. In that embodiment, interconnect 120 may be reoriented to a direction normal to printed circuit board 110.

As an example embodiment of operation, first plurality of layers 115 may be deposited to form a portion or all of printed circuit board 110 using a variety of different manufacturing processes, such as a laminating process or a three-dimensional printing process. Interconnect 120 may be formed integrally with printed circuit board 110 by depositing second plurality of layers 121 on at least a portion of first plurality of layers 115 using a variety of different manufacturing processes, such as a laminating process or a three-dimensional printing process.

Board integrated interconnect apparatus 100 provides several advantages. As one advantage, some embodiments may reduce the profile of printed circuit board 110 thereby allowing one or more printed circuit boards 110 to fit within a small device. As another advantage, certain embodiments may improve the yield in the manufacturing process by reducing the need for soldering techniques. As another advantage, some embodiments may reduce the need for electrical connections by utilizing optical connections. As another advantage, some embodiments may improve signal quality by reducing the usage of solder joints between printed circuit board 110 and interconnects 120.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications.

What is claimed is:

1. An apparatus, comprising:
    a printed circuit board comprising:
        a first plurality of layers formed using a three-dimensional printing process;
        a top surface;
        a bottom surface opposed to the top surface; and
        a first plane on the top surface and parallel to the top surface; and
    an interconnect integral to the printed circuit board, the interconnect positioned below the first plane of the top surface and oriented along a second plane that is distinct from the first plane and comprising:
        a second plurality of layers on at least a portion of the first plurality of layers, the second plurality of layers formed using the three-dimensional printing process;
        a stabilizing structure; and
        a contact positioned within the stabilizing structure;
    wherein:
        the stabilizing structure comprises a first material that is non-conductive and the contact comprises a second material that is different than the first material;
        the contact comprises an electrical contact; and
        the interconnect comprises a component connector.

2. A method, comprising:
    forming a printed circuit board by depositing a first plurality of layers; and
    forming an interconnect integral to the printed circuit board by depositing a second plurality of layers on at least a portion of the first plurality of layers, the interconnect comprising a stabilizing structure and a contact positioned within the stabilizing structure, the stabilizing structure being made of a first material and the contact being made of a second material that is different than the first material.

3. The method of claim 2, wherein:
the second plurality of layers are deposited on the first plurality of layers such that the interconnect is in a first position recessed within the printed circuit board; and
the method further comprises reorienting the interconnect from the first position to a second position that is distinct from the first position.

4. The method of claim 2, wherein the printed circuit board and the interconnect are formed using a laminating process.

5. The method of claim 2, wherein the printed circuit board and the interconnect are formed using a three-dimensional printing process.

6. The method of claim 2, wherein the interconnect extends a non-zero length in a direction along a plane that intersects a surface of the printed circuit board.

7. The method of claim 2, wherein the interconnect is recessed within the printed circuit board.

8. The method of claim 2, wherein the contact is electrical or optical.

9. The method of claim 2, wherein the interconnect comprises a component connector.

10. The method of claim 2, wherein the interconnect comprises a microprocessor socket.

11. The method of claim 2, wherein the first material is a non-conductive material.

12. An apparatus, comprising:
a printed circuit board comprising a first plurality of layers; and
an interconnect integral to the printed circuit board, the interconnect comprising a second plurality of layers on at least a portion of the first plurality of layers, a stabilizing structure, and a contact positioned within the stabilizing structure, the stabilizing structure being made of a first material and the contact being made of a second material that is different than the first material.

13. The apparatus of claim 12, wherein the printed circuit board and the interconnect are formed using a laminating process.

14. The apparatus of claim 12, wherein the printed circuit board and the interconnect are formed using a three-dimensional printing process.

15. The apparatus of claim 12, wherein the interconnect is formed in-plane with the printed circuit board.

16. The apparatus of claim 12, wherein the interconnect extends a non-zero length in a direction along a plane that intersects a surface of the printed circuit board.

17. The apparatus of claim 12, wherein the interconnect is recessed within the printed circuit board.

18. The apparatus of claim 12, wherein the contact is electrical or optical.

19. The apparatus of claim 12, wherein the interconnect comprises a component connector.

20. The apparatus of claim 12, wherein the first material is a non-conductive material.

* * * * *